United States Patent
Nakamura

(10) Patent No.: US 10,523,174 B2
(45) Date of Patent: Dec. 31, 2019

(54) ELASTIC WAVE DEVICE

(71) Applicant: Murata Manufacturing Co., Ltd., Nagaokakyo-shi, Kyoto-fu (JP)

(72) Inventor: Shinichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/282,819

(22) Filed: Feb. 22, 2019

(65) Prior Publication Data

US 2019/0190480 A1 Jun. 20, 2019

Related U.S. Application Data

(63) Continuation of application No. PCT/JP2017/028479, filed on Aug. 4, 2017.

(30) Foreign Application Priority Data

Aug. 25, 2016 (JP) .................. 2016-164338

(51) Int. Cl.
*H03H 7/01* (2006.01)
*H03H 9/64* (2006.01)
(Continued)

(52) U.S. Cl.
CPC ............ *H03H 7/0161* (2013.01); *H03H 7/42* (2013.01); *H03H 7/461* (2013.01); *H03H 7/463* (2013.01);
(Continued)

(58) Field of Classification Search
CPC ........ H03H 7/0161; H03H 7/42; H03H 7/461; H03H 7/463; H03H 9/24; H03H 9/6436; H03H 9/6483; H03H 9/725
See application file for complete search history.

(56) References Cited

U.S. PATENT DOCUMENTS

2003/0067508 A1    4/2003   Mizutani et al.
2012/0274417 A1   11/2012   Kihara et al.
(Continued)

FOREIGN PATENT DOCUMENTS

JP           2013-062556 A    4/2013
KR   10-2003-0019272 A    3/2003
(Continued)

OTHER PUBLICATIONS

Official Communication issued in International Patent Application No. PCT/JP2017/028479, dated Oct. 24, 2017.

*Primary Examiner* — Robert J Pascal
*Assistant Examiner* — Samuel S Outten
(74) *Attorney, Agent, or Firm* — Keating & Bennett, LLP

(57) ABSTRACT

An elastic wave device includes an unbalanced first bandpass filter and a second bandpass filter. The first bandpass filter includes first and second longitudinally coupled resonator elastic wave filters that are connected in parallel between an output terminal and an antenna terminal, and first and second elastic wave resonators respectively connected between the first and second longitudinally coupled resonator elastic wave filters and the antenna terminal. The second bandpass filter is connected to the antenna terminal and has a passband different from a passband of the first bandpass filter. An elastic wave wavelength specified by an electrode finger pitch of an IDT electrode included in the first elastic wave resonator and an elastic wave wavelength specified by an electrode finger pitch of an IDT electrode included in the second elastic wave resonator are different from each other.

12 Claims, 7 Drawing Sheets

(51) Int. Cl.
*H03H 7/42* (2006.01)
*H03H 7/46* (2006.01)
*H03H 9/24* (2006.01)
*H03H 9/72* (2006.01)

(52) U.S. Cl.
CPC ............ *H03H 9/24* (2013.01); *H03H 9/6436* (2013.01); *H03H 9/6483* (2013.01); *H03H 9/725* (2013.01)

(56) References Cited

U.S. PATENT DOCUMENTS

| | | |
|---|---|---|
| 2014/0176258 A1 | 6/2014 | Yasuda |
| 2015/0155850 A1 | 6/2015 | Kuzushita et al. |
| 2016/0028366 A1 | 1/2016 | Takamine |
| 2016/0094198 A1 | 3/2016 | Takamine |
| 2016/0173061 A1 | 6/2016 | Takamine |

FOREIGN PATENT DOCUMENTS

| | | |
|---|---|---|
| KR | 10-2014-0037269 A | 3/2014 |
| KR | 10-2015-0036732 A | 4/2015 |
| WO | 2013/031726 A1 | 3/2013 |
| WO | 2014/167752 A1 | 10/2014 |
| WO | 2014/199674 A1 | 12/2014 |
| WO | 2015/040921 A1 | 3/2015 | though
ELASTIC WAVE DEVICE

CROSS REFERENCE TO RELATED APPLICATIONS

This application claims the benefit of priority to Japanese Patent Application No. 2016-164338 filed on Aug. 25, 2016 and is a Continuation Application of PCT Application No. PCT/JP2017/028479 filed on Aug. 4, 2017. The entire contents of each of these applications are hereby incorporated herein by reference.

BACKGROUND OF THE INVENTION

1. Field of the Invention

The present invention relates to an elastic wave device including a plurality of bandpass filters.

2. Description of the Related Art

Elastic wave devices have been widely used in, for example, filters of cellular phones. International Publication No. 2015/040921 discloses an example of a duplexer including a reception filter including a longitudinally coupled resonator elastic wave filter. In the reception filter, an elastic wave resonator is connected between an antenna terminal and the longitudinally coupled resonator elastic wave filter to provide impedance matching for a transmission filter and the reception filter.

However, it is difficult for the elastic wave device disclosed in International Publication No. 2015/040921 to achieve sufficient impedance matching and an increase in an out-of-band attenuation at the same time.

SUMMARY OF THE INVENTION

Preferred embodiments of the present invention provide elastic wave devices that are each able to achieve sufficient impedance matching and an increase in an out-of-band attenuation at the same time.

An elastic wave device according to a preferred embodiment of the present invention includes an antenna terminal connected to an antenna, an unbalanced first bandpass filter, and a second bandpass filter. The first bandpass filter includes a first longitudinally coupled resonator elastic wave filter and a second longitudinally coupled resonator elastic wave filter that are connected to the antenna terminal and are connected in parallel between the antenna terminal and an output terminal, a first elastic wave resonator that is connected between the first longitudinally coupled resonator elastic wave filter and the antenna terminal and is not connected between the second longitudinally coupled resonator elastic wave filter and the antenna terminal, and a second elastic wave resonator that is connected between the second longitudinally coupled resonator elastic wave filter and the antenna terminal and is not connected between the first longitudinally coupled resonator elastic wave filter and the antenna terminal. The second bandpass filter is connected to the antenna terminal and has a passband different from a passband of the first bandpass filter. Each of the first elastic wave resonator and the second elastic wave resonator includes an IDT electrode. An elastic wave wavelength specified by an electrode finger pitch of the IDT electrode included in the first elastic wave resonator and an elastic wave wavelength specified by an electrode finger pitch of the IDT electrode included in the second elastic wave resonator are different from each other.

In an elastic wave device according to a preferred embodiment of the present invention, a difference between an elastic wave wavelength specified by an electrode finger pitch of the IDT electrode included in the first elastic wave resonator and an elastic wave wavelength specified by an electrode finger pitch of the IDT electrode included in the second elastic wave resonator is less than or equal to about 3% of the elastic wave wavelength specified by the electrode finger pitch of the IDT electrode included in the first elastic wave resonator. In this case, improved impedance matching for the first bandpass filter and the second bandpass filter is able to be achieved.

In an elastic wave device according to a preferred embodiment of the present invention, between the first longitudinally coupled resonator elastic wave filter and the antenna terminal, the first elastic wave resonator is disposed nearest to the antenna terminal. Between the second longitudinally coupled resonator elastic wave filter and the antenna terminal, the second elastic wave resonator is disposed nearest to the antenna terminal. In this case, improved impedance matching for the first bandpass filter and the second bandpass filter is able to be achieved.

In an elastic wave device according to a preferred embodiment of the present invention, a passband of the first bandpass filter is provided by the first longitudinally coupled resonator elastic wave filter and the second longitudinally coupled resonator elastic wave filter. Each of the first longitudinally coupled resonator elastic wave filter and the second longitudinally coupled resonator elastic wave filter has a single stage configuration. In this case, preferred embodiments of the present invention are able to be particularly suitably applied.

In an elastic wave device according to a preferred embodiment of the present invention, the first bandpass filter is a reception filter and the second bandpass filter is a transmission filter. Accordingly, an elastic wave device according to a preferred embodiment of the present invention is a duplexer.

In an elastic wave device according to a preferred embodiment of the present invention, at least one bandpass filter connected to the antenna terminal is further provided.

According to preferred embodiments of the present invention, elastic wave devices that are able to achieve sufficient impedance matching and an increase in an out-of-band attenuation at the same time are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

It is to be noted that the preferred embodiments described in this specification are merely illustrative and the configurations described below may be partially replaced or combined between the different preferred embodiments.

Figure 1:
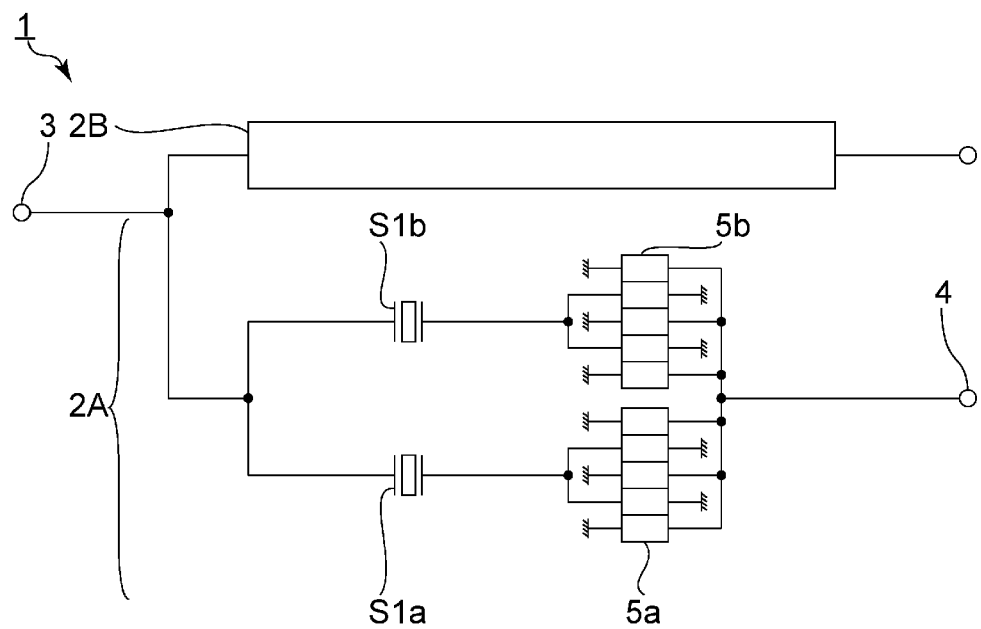
FIG. 1 is a circuit diagram of an elastic wave device according to a first preferred embodiment of the present invention.

FIG. 1 is a circuit diagram of an elastic wave device according to a first preferred embodiment of the present invention.

An elastic wave device 1 includes a first bandpass filter 2A and a second bandpass filter 2B whose passband is different from that of the first bandpass filter 2A. The elastic wave device 1 includes an antenna terminal 3 connected to an antenna. The first bandpass filter 2A and the second bandpass filter 2B are connected in common to the antenna terminal 3.

In the present preferred embodiment, the first bandpass filter 2A is a reception filter and the second bandpass filter 2B is a transmission filter. The elastic wave device 1 is a duplexer.

The first bandpass filter 2A includes an output terminal 4. The first bandpass filter 2A includes a first longitudinally coupled resonator elastic wave filter 5a and a second longitudinally coupled resonator elastic wave filter 5b that are connected in parallel between the antenna terminal 3 and the output terminal 4. The first longitudinally coupled resonator elastic wave filter 5a and the second longitudinally coupled resonator elastic wave filter 5b provide the passband of the first bandpass filter 2A. The first bandpass filter 2A is an unbalanced bandpass filter.

Figure 2:
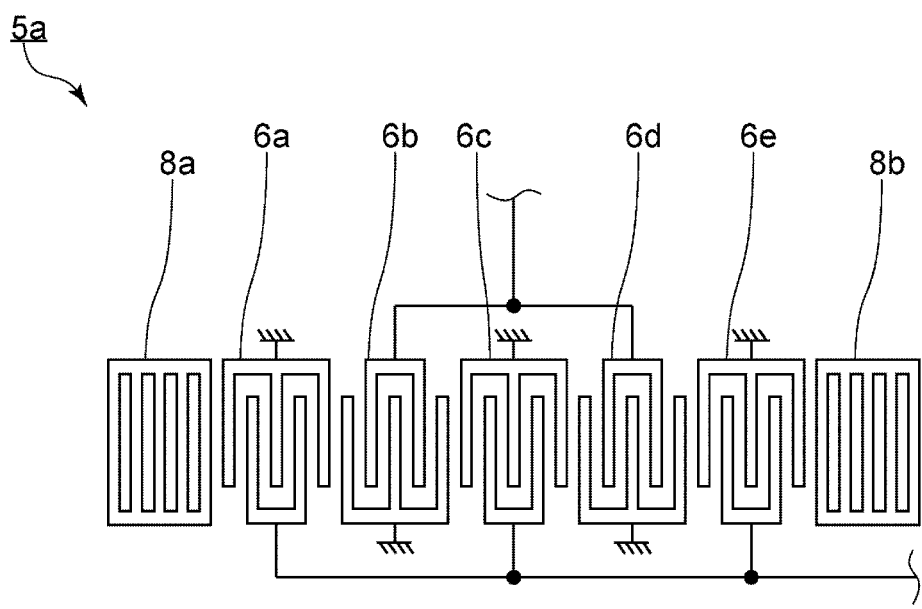
FIG. 2 is a plan view of a first longitudinally coupled resonator elastic wave filter according to the first preferred embodiment of the present invention.

FIG. 2 is a plan view of a first longitudinally coupled resonator elastic wave filter according to the first preferred embodiment.

The first longitudinally coupled resonator elastic wave filter 5a includes IDT electrodes 6a to 6e. The application of an AC voltage to the IDT electrodes 6b and 6d excites elastic waves. The IDT electrodes 6a to 6e are disposed along an elastic wave propagation direction. On both sides of the IDT electrodes 6a to 6e in the elastic wave propagation direction, reflectors 8a and 8b are respectively disposed. Thus, in the present preferred embodiment, the first longitudinally coupled resonator elastic wave filter 5a is preferably, for example, a 5-IDT longitudinally coupled resonator elastic wave filter having a single stage configuration. The second longitudinally coupled resonator elastic wave filter 5b preferably has the same or substantially the same configuration as the first longitudinally coupled resonator elastic wave filter 5a. FIG. 1 schematically illustrates the first longitudinally coupled resonator elastic wave filter 5a and the second longitudinally coupled resonator elastic wave filter 5b.

Each of the first longitudinally coupled resonator elastic wave filter 5a and the second longitudinally coupled resonator elastic wave filter 5b may be of another type other than the 5-IDT longitudinally coupled resonator elastic wave filter, such as a 3-IDT longitudinally coupled resonator elastic wave filter or a 7-IDT longitudinally coupled resonator elastic wave filter, for example. At least one of the first longitudinally coupled resonator elastic wave filter 5a and the second longitudinally coupled resonator elastic wave filter 5b may include two or more stages.

The first bandpass filter 2A includes a first elastic wave resonator S1a connected between the antenna terminal 3 and the first longitudinally coupled resonator elastic wave filter 5a and a second elastic wave resonator S1b connected between the antenna terminal 3 and the second longitudinally coupled resonator elastic wave filter 5b.

More specifically, the first elastic wave resonator S1a is connected between the antenna terminal 3 and the first longitudinally coupled resonator elastic wave filter 5a and is not connected between the antenna terminal 3 and the second longitudinally coupled resonator elastic wave filter 5b.

The second elastic wave resonator S1b is connected between the antenna terminal 3 and the second longitudinally coupled resonator elastic wave filter 5b and is not connected between the antenna terminal 3 and the first longitudinally coupled resonator elastic wave filter 5a.

Figure 3:
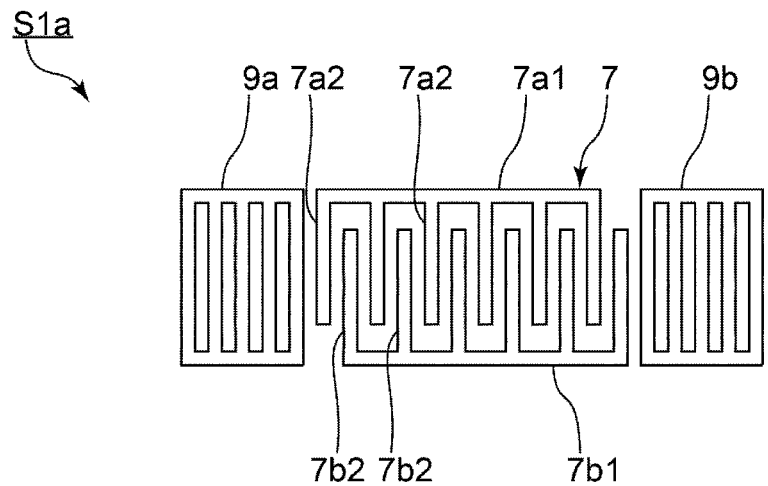
FIG. 3 is a plan view of a first elastic wave resonator according to the first preferred embodiment of the present invention.

FIG. 3 is a plan view of a first elastic wave resonator according to the first preferred embodiment.

The first elastic wave resonator S1a includes an IDT electrode 7. On both sides of the IDT electrode 7 in an elastic wave propagation direction, reflectors 9a and 9b are respectively disposed. The IDT electrode 7 includes a first busbar 7a1 and a second busbar 7b1 opposing each other. The IDT electrode 7 includes a plurality of first electrode fingers 7a2 each including one end connected to the first busbar 7a1. The IDT electrode 7 further includes a plurality of second electrode fingers 7b2 each including one end connected to the second busbar 7b1. The first electrode fingers 7a2 and the second electrode fingers 7b2 are interdigitated with each other. The wavelength of an elastic wave which is specified by the electrode finger pitch of the IDT electrode 7 is represented by λ1. The electrode finger pitch is the distance between centers of adjacent first electrode fingers 7a2 or of adjacent second electrode fingers 7b2.

The second elastic wave resonator S1b also includes an IDT electrode and reflectors the same as or similar to the first elastic wave resonator S1a. The wavelength of an elastic wave which is specified by the electrode finger pitch of the IDT electrode included in the second elastic wave resonator is represented by $\lambda 2$. The wavelengths $\lambda 1$ and $\lambda 2$ are different from each other. More specifically, in the present preferred embodiment, the equations of $\lambda 1$=about 3.6612 μm and $\lambda 2$=about 3.6112 μm, for example, are preferably satisfied. Thus, the difference between the wavelengths $\lambda 1$ and $\lambda 2$ is preferably about 1.36% of the wavelength $\lambda 1$, for example. The values of the wavelengths $\lambda 1$ and $\lambda 2$ are not limited to the above-described values.

The second bandpass filter 2B schematically illustrated in FIG. 1 may have any configuration.

As described above, in the present preferred embodiment, the first elastic wave resonator S1a is connected between the antenna terminal 3 and the first longitudinally coupled resonator elastic wave filter 5a, the second elastic wave resonator S1b is connected between the antenna terminal 3 and the second longitudinally coupled resonator elastic wave filter 5b, and the wavelengths $\lambda 1$ and $\lambda 2$ are different from each other. As a result, sufficient impedance matching for the first bandpass filter 2A and the second bandpass filter 2B and an increase in the out-of-band attenuation of the first bandpass filter 2A are able be achieved at the same time. This will be described by comparing the present preferred embodiment with a comparative example.

Figure 4:
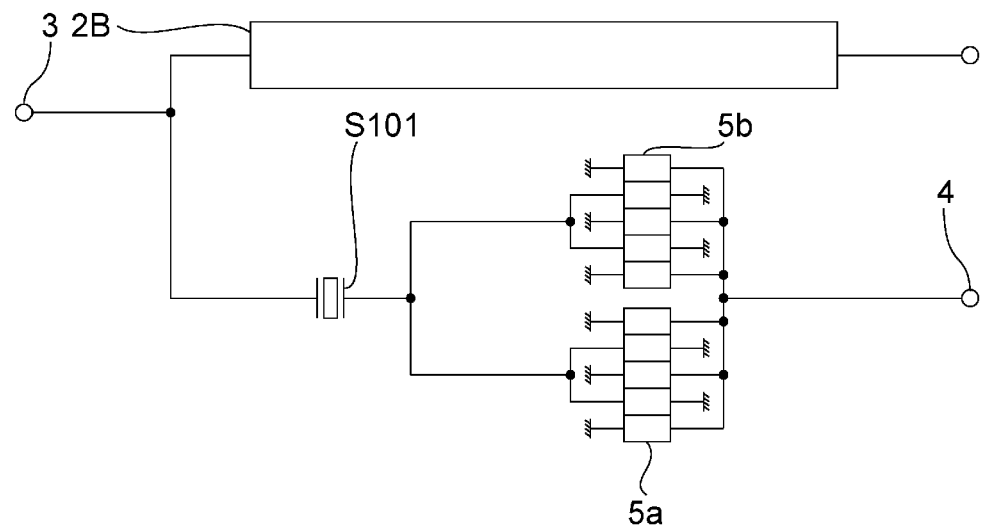
FIG. 4 is a circuit diagram of an elastic wave device according to a comparative example.

As illustrated in FIG. 4, an elastic wave device according to a comparative example does not include the first and second elastic wave resonators according to the present invention and differs from the first preferred embodiment in that the first longitudinally coupled resonator elastic wave filter 5a and the second longitudinally coupled resonator elastic wave filter 5b are connected in common to an elastic wave resonator 5101 on the side of the antenna terminal 3. The elastic wave resonator 5101 provides impedance matching.

Figure 5:
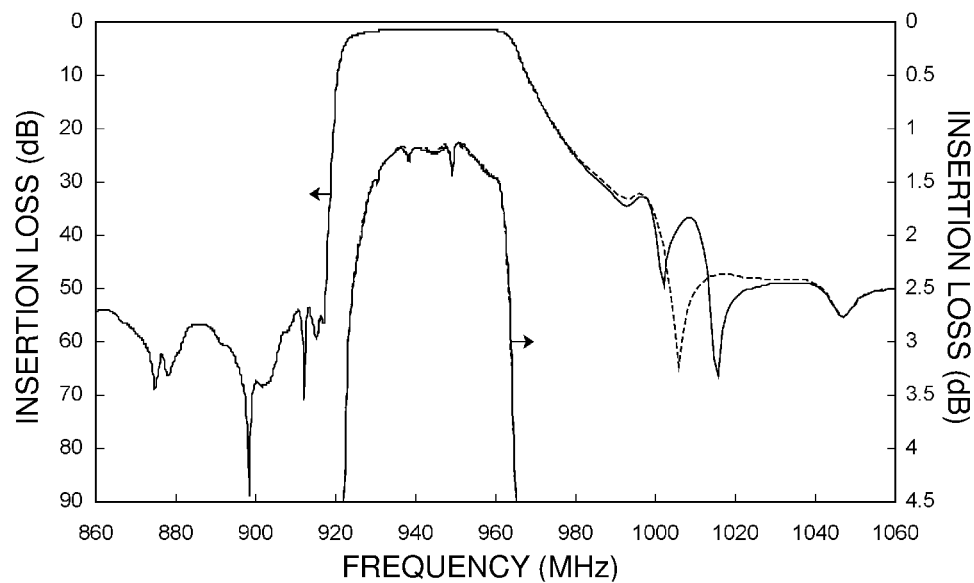
FIG. 5 is a diagram illustrating the attenuation-frequency characteristics of a first bandpass filter according to the first preferred embodiment of the present invention and a first bandpass filter according to a comparative example.
Figure 6:
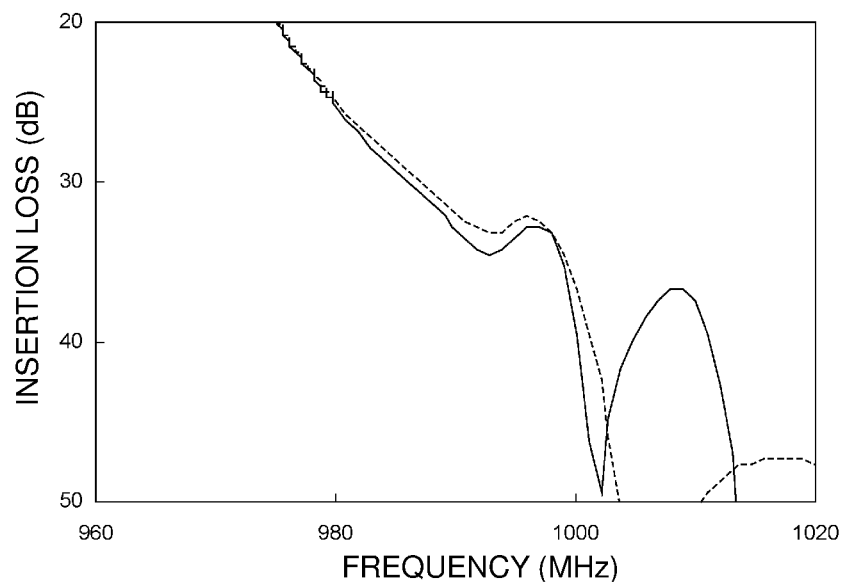
FIG. 6 is an enlarged view of FIG. 5.
Figure 7:
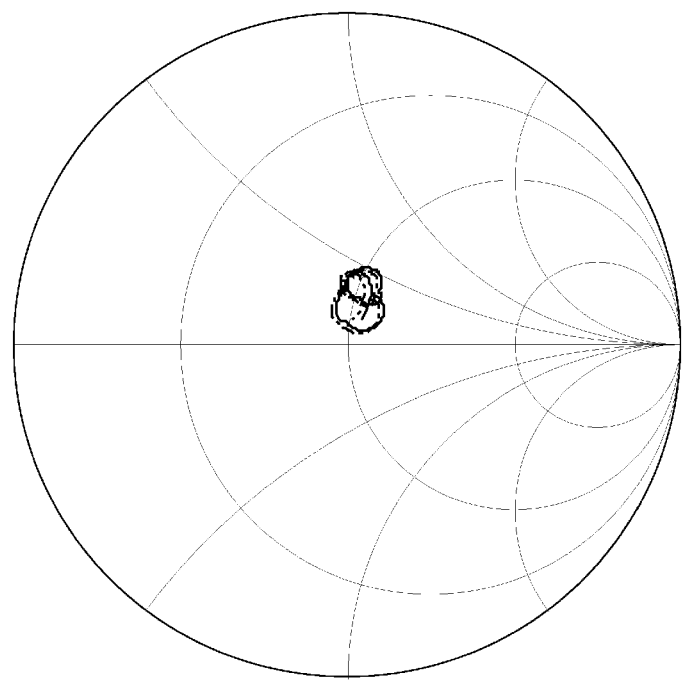
FIG. 7 illustrates impedance Smith charts of first and second bandpass filters according to the first preferred embodiment of the present invention and first and second bandpass filters according to a comparative example.

FIG. 5 is a diagram illustrating the attenuation-frequency characteristics of a first bandpass filter according to the first preferred embodiment and a first bandpass filter in a comparative example. FIG. 6 is an enlarged view of FIG. 5. FIG. 7 illustrates impedance Smith charts of first and second bandpass filters according to the first preferred embodiment and first and second bandpass filters in a comparative example. In FIGS. 5 to 7, a solid line represents a result generated by the first preferred embodiment and a broken line represents a result generated by the comparative example.

It is apparent from FIGS. 5 and 6 that around 980 MHz to 1000 MHz on the higher frequency side of a passband, an out-of-band attenuation in the first preferred embodiment is larger than that in the comparative example. In addition, it is apparent from FIG. 7 that sufficient impedance matching is able to be achieved in the first preferred embodiment as in the comparative example.

In the first preferred embodiment illustrated in FIG. 1, the first elastic wave resonator S1a is connected between the first longitudinally coupled resonator elastic wave filter 5a and the antenna terminal 3 and the second elastic wave resonator S1b is connected between the second longitudinally coupled resonator elastic wave filter 5b and the antenna terminal 3. As a result, sufficient impedance matching is able to be achieved.

In addition, the wavelength $\lambda 1$ of an elastic wave which is specified by the electrode finger pitch of the IDT electrode included in the first elastic wave resonator S1a and the wavelength $\lambda 2$ of an elastic wave which is specified by the electrode finger pitch of the IDT electrode included in the second elastic wave resonator S1b are different from each other. As a result, an attenuation outside a passband provided by the first longitudinally coupled resonator elastic wave filter 5a and the second longitudinally coupled resonator elastic wave filter 5b is able to be increased.

It is preferable that the difference between the wavelengths $\lambda 1$ and $\lambda 2$ is less than or equal to about 3% of the wavelength $\lambda 1$, for example. As a result, the impedance matching for the first bandpass filter 2A and the second bandpass filter 2B is able to be more sufficiently achieved. This will be described with reference to FIGS. 8 to 10.

Here, an elastic wave device according to a first modification of the first preferred embodiment in which the difference between the wavelengths $\lambda 1$ and $\lambda 2$ is about 3%, for example, of the wavelength $\lambda 1$ and an elastic wave device according to a second modification of the first preferred embodiment in which the difference between the wavelengths $\lambda 1$ and $\lambda 2$ is about 5%, for example, of the wavelength $\lambda 1$ were produced and the evaluations of attenuation-frequency characteristics and impedance matching were performed.

Figure 8:
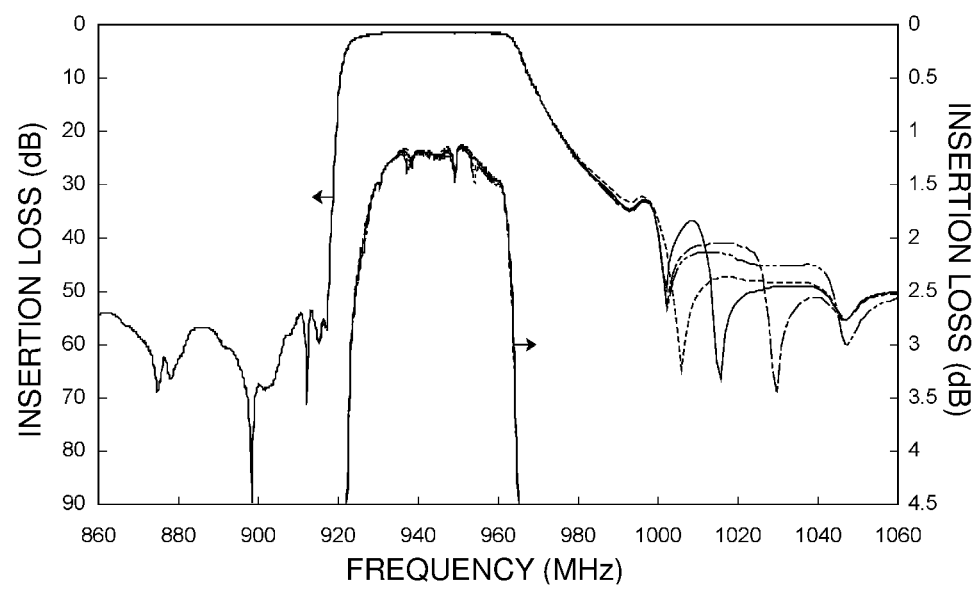
FIG. 8 is a diagram illustrating the attenuation-frequency characteristics of a first bandpass filter according to the first preferred embodiment of the present invention, a first bandpass filter according to a first modification of the first preferred embodiment of the present invention, a first bandpass filter according to a second modification of the first preferred embodiment of the present invention, and a first bandpass filter according to a comparative example.

FIG. 8 is a diagram illustrating the attenuation-frequency characteristics of a first bandpass filter according to the first preferred embodiment, a first bandpass filter according to a first modification of the first preferred embodiment, a first bandpass filter according to a second modification of the first preferred embodiment, and a first bandpass filter according to a comparative example. In FIG. 8, a solid line represents a result generated by the first preferred embodiment, a broken line represents a result generated by the comparative example, a dot-and-dash line represents a result generated by the first modification, and a dash-dot-dot line represents a result generated by the second modification.

As illustrated in FIG. 8, similar to the first preferred embodiment, the first and second modifications are able to increase an out-of-band attenuation as compared with the comparative example.

Figure 9:
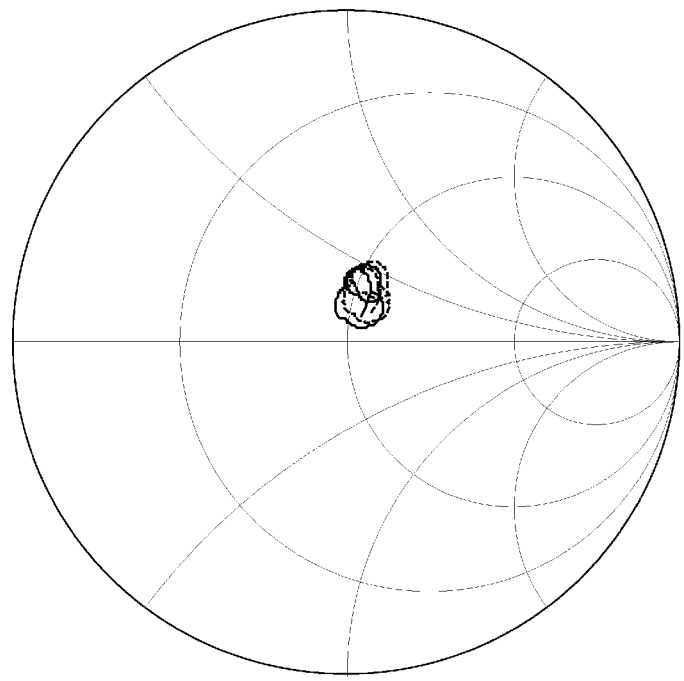
FIG. 9 illustrates impedance Smith charts of first and second bandpass filters according to the first preferred embodiment of the present invention and first and second bandpass filters according to the second modification of the first preferred embodiment of the present invention.
Figure 10:
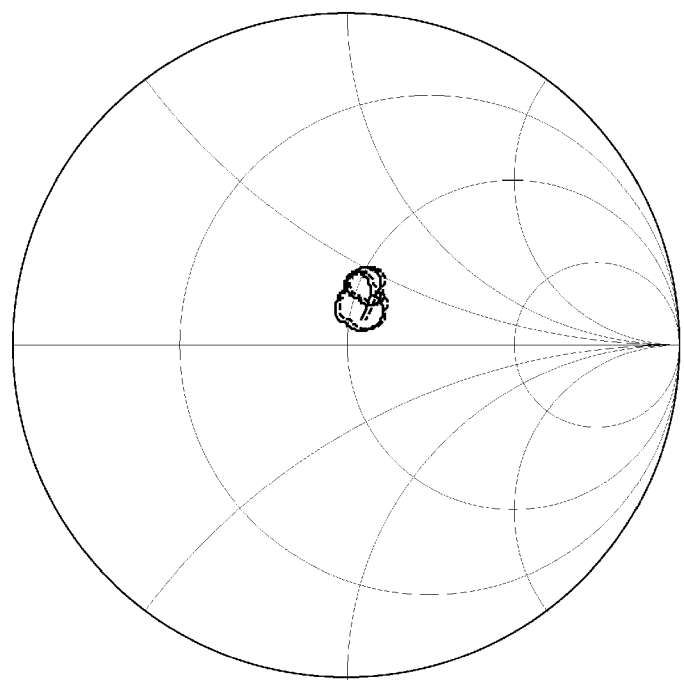
FIG. 10 illustrates impedance Smith charts of first and second bandpass filters according to the first preferred embodiment of the present invention and first and second bandpass filters according to the first modification of the first preferred embodiment of the present invention.

FIG. 9 illustrates impedance Smith charts of first and second bandpass filters according to the first preferred embodiment and first and second bandpass filters according to the second modification of the first preferred embodiment. FIG. 10 illustrates impedance Smith charts of first and second bandpass filters according to the first preferred embodiment and first and second bandpass filters according to the first modification of the first preferred embodiment. In FIG. 9, a solid line represents a result generated by the first preferred embodiment and a broken line represents a result generated by the second modification. In FIG. 10, a solid line represents a result generated by the first preferred embodiment and a broken line represents a result generated by the first modification.

As illustrated in FIG. 9, the spread of the broken line representing a result generated by the second modification in which the difference between the wavelengths $\lambda 1$ and $\lambda 2$ is about 5% of the wavelength $\lambda 1$ is small similar to in the first preferred embodiment. Since the track of the broken line is nearly circular and is also close to a characteristic impedance, impedance matching is able to be achieved. The result generated by the second modification is more spaced apart from the characteristic impedance than the result generated by the first preferred embodiment.

As illustrated in FIG. 10, in the first modification in which the difference between the wavelengths λ1 and λ2 is about 3% of the wavelength λ1, sufficient impedance matching is able to be achieved similar to in the first preferred embodiment. Thus, by setting the difference between the wavelengths to about 3% or less, for example, better impedance matching is able to be achieved.

Figure 11:
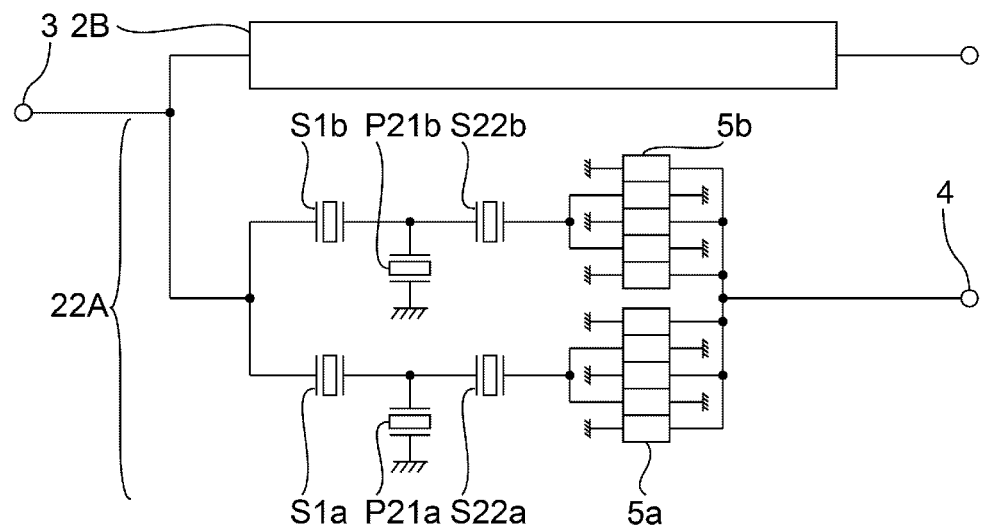
FIG. 11 is a circuit diagram of an elastic wave device according to a third modification of the first preferred embodiment of the present invention.

In the present preferred embodiment illustrated in FIG. 1, a component other than the first elastic wave resonator S1a is not connected between the antenna terminal 3 and the first longitudinally coupled resonator elastic wave filter 5a. Between the antenna terminal 3 and the second longitudinally coupled resonator elastic wave filter 5b, a component other than the second elastic wave resonator S1b is not connected. In a third modification of the first preferred embodiment illustrated in FIG. 11, an elastic wave resonator S22a may be connected between the antenna terminal 3 and the first longitudinally coupled resonator elastic wave filter 5a and an elastic wave resonator S22b may be connected between the antenna terminal 3 and the second longitudinally coupled resonator elastic wave filter 5b. A first bandpass filter 22A may include an elastic wave resonator P21a connected between the ground potential and a series arm that connects the antenna terminal 3 and the first longitudinally coupled resonator elastic wave filter 5a. The first bandpass filter 22A may also include an elastic wave resonator P21b connected between the ground potential and a series arm that connects the antenna terminal 3 and the second longitudinally coupled resonator elastic wave filter 5b.

In the case in which elastic wave resonators other than the first elastic wave resonator S1a and the second elastic wave resonator S1b are provided, it is preferable that the first elastic wave resonator S1a is nearest to the antenna terminal 3 between the first longitudinally coupled resonator elastic wave filter 5a and the antenna terminal 3 and the second elastic wave resonator S1b is nearest to the antenna terminal 3 between the second longitudinally coupled resonator elastic wave filter 5b and the antenna terminal 3. As a result, better impedance matching is able to be more effectively achieved.

Figure 12:
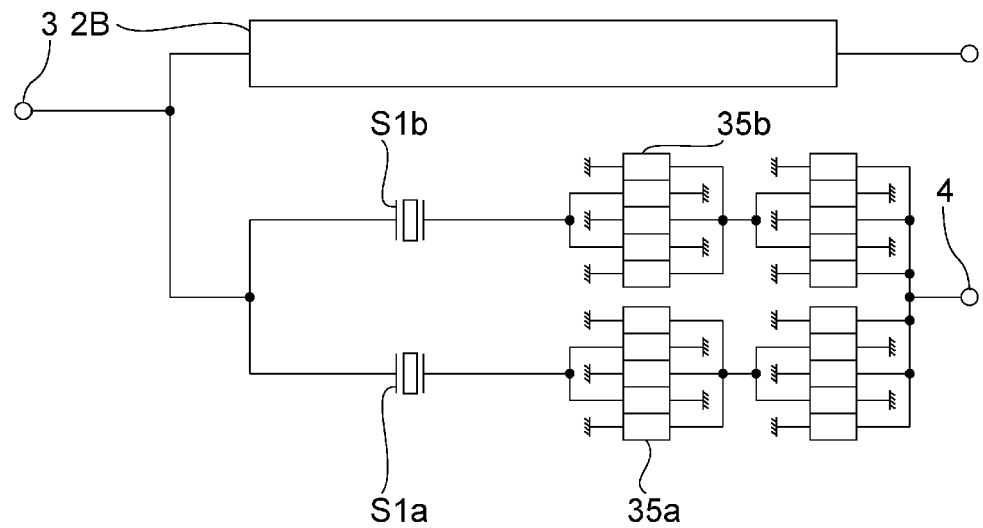
FIG. 12 is a circuit diagram of an elastic wave device according to a fourth modification of the first preferred embodiment of the present invention.

In a fourth modification of the first preferred embodiment illustrated in FIG. 12, each of a first longitudinally coupled resonator elastic wave filter 35a and a second longitudinally coupled resonator elastic wave filter 35b may include two or more stages.

Alternatively, referring back to FIG. 1, another longitudinally coupled resonator elastic wave filter may be connected between the first longitudinally coupled resonator elastic wave filter 5a and the output terminal 4. Between this longitudinally coupled resonator elastic wave filter and the first longitudinally coupled resonator elastic wave filter 5a, an elastic wave resonator may be connected. The circuit configuration of the first bandpass filter 2A is not particularly limited as long as it includes the first elastic wave resonator S1a, the second elastic wave resonator S1b, the first longitudinally coupled resonator elastic wave filter 5a, and the second longitudinally coupled resonator elastic wave filter 5b.

In general, it is more difficult to achieve impedance matching in the case in which each of the first and second longitudinally coupled resonator elastic wave filters has a single stage configuration as compared to the case in which each of the first and second longitudinally coupled resonator elastic wave filters has a multiple stage configuration. Accordingly, preferred embodiments of the present invention are particularly suitably applied to the case in which each of the first longitudinally coupled resonator elastic wave filter 5a and the second longitudinally coupled resonator elastic wave filter 5b according to the first preferred embodiment has a single stage configuration as illustrated in FIG. 1.

An elastic wave device according to the first preferred embodiment and elastic wave devices that are the first to fourth modifications of the first preferred embodiment are preferably duplexers, for example. Preferred embodiments of the present invention may also be suitably applied to a bundled elastic wave filter in which both of a first bandpass filter and a second bandpass filter are reception filters.

Figure 13:
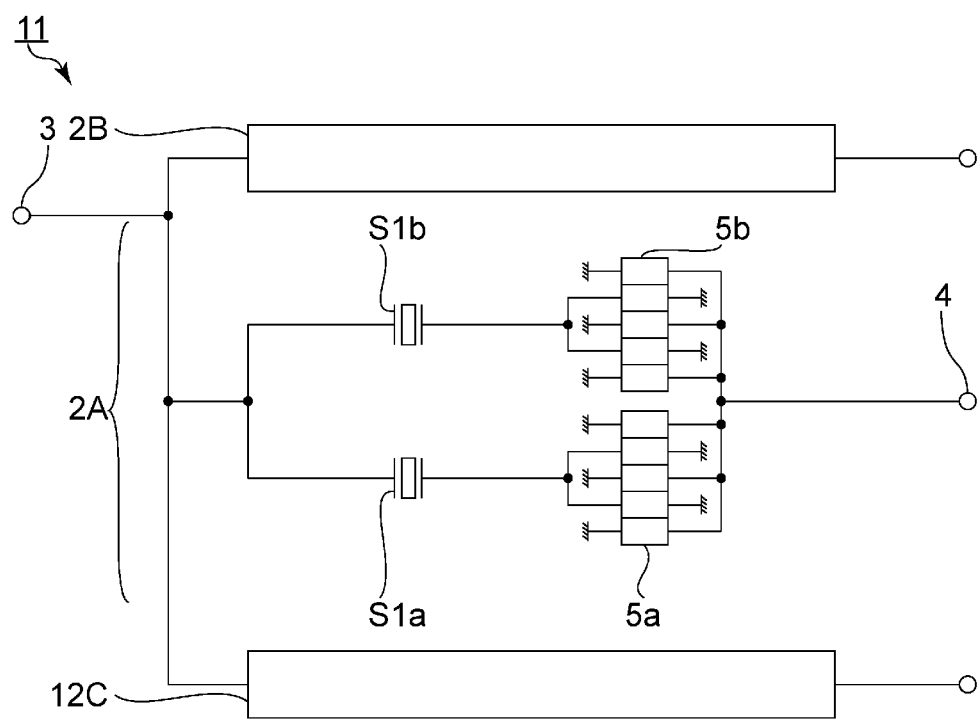
FIG. 13 is a circuit diagram of an elastic wave device according to a second preferred embodiment of the present invention.

FIG. 13 is a circuit diagram of an elastic wave device according to a second preferred embodiment of the present invention.

An elastic wave device 11 according to the second preferred embodiments differs from the elastic wave device according to the first preferred embodiment in that it includes a third bandpass filter 12C connected to the antenna terminal 3. The remaining configuration of the elastic wave device 11 is the same or substantially the same as that of the elastic wave device 1 according to the first preferred embodiment.

Also in the present preferred embodiment, sufficient impedance matching for the first bandpass filter 2A and the second bandpass filter 2B is able to be achieved as in the first preferred embodiment and out-of-band attenuation of the first bandpass filter 2A is able to be increased.

A bandpass filter other than the first bandpass filter 2A, the second bandpass filter 2B, and the third bandpass filter 12C may be further connected to the antenna terminal 3.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    an antenna terminal connected to an antenna;
    an unbalanced first bandpass filter including:
        a first longitudinally coupled resonator elastic wave filter and a second longitudinally coupled resonator elastic wave filter that are connected to the antenna terminal and are connected in parallel between the antenna terminal and an output terminal;
        a first elastic wave resonator that is connected between the first longitudinally coupled resonator elastic wave filter and the antenna terminal and is not connected between the second longitudinally coupled resonator elastic wave filter and the antenna terminal; and
        a second elastic wave resonator that is connected between the second longitudinally coupled resonator elastic wave filter and the antenna terminal and is not connected between the first longitudinally coupled resonator elastic wave filter and the antenna terminal; and
    a second bandpass filter that is connected to the antenna terminal and has a passband different from a passband of the first bandpass filter; wherein
    each of the first elastic wave resonator and the second elastic wave resonator includes an IDT electrode; and
    an elastic wave wavelength specified by an electrode finger pitch of the IDT electrode included in the first elastic wave resonator and an elastic wave wavelength specified by an electrode finger pitch of the IDT electrode included in the second elastic wave resonator are different from each other.

2. The elastic wave device according to claim 1, wherein a third elastic wave resonator is connected between a ground potential and a series arm that connects the antenna terminal and the first longitudinally coupled resonator elastic wave filter; and
a fourth elastic wave resonator is connected between the ground potential and a series arm that connects the antenna terminal and the second longitudinally coupled resonator elastic wave filter.

3. The elastic wave device according to claim 2, wherein the first elastic wave resonator is disposed nearer to the antenna terminal than the third elastic wave resonator is to the antenna terminal; and
the second elastic wave resonator is disposed nearer to the antenna terminal than the fourth elastic wave resonator is to the antenna terminal.

4. The elastic wave device according to claim 1, wherein a difference between an elastic wave wavelength specified by an electrode finger pitch of the IDT electrode included in the first elastic wave resonator and an elastic wave wavelength specified by an electrode finger pitch of the IDT electrode included in the second elastic wave resonator is less than or equal to about 3% of the elastic wave wavelength specified by the electrode finger pitch of the IDT electrode included in the first elastic wave resonator.

5. The elastic wave device according to claim 1, wherein between the first longitudinally coupled resonator elastic wave filter and the antenna terminal, the first elastic wave resonator is disposed nearest to the antenna terminal; and
between the second longitudinally coupled resonator elastic wave filter and the antenna terminal, the second elastic wave resonator is disposed nearest to the antenna terminal.

6. The elastic wave device according to claim 1, wherein a passband of the first bandpass filter is provided by the first longitudinally coupled resonator elastic wave filter and the second longitudinally coupled resonator elastic wave filter; and
each of the first longitudinally coupled resonator elastic wave filter and the second longitudinally coupled resonator elastic wave filter has a single stage configuration.

7. The elastic wave device according to claim 1, wherein the first bandpass filter is a reception filter and the second bandpass filter is a transmission filter; and
the reception filter and the transmission filter define a duplexer.

8. The elastic wave device according to claim 1, further comprising at least one bandpass filter connected to the antenna terminal.

9. The elastic wave device according to claim 1, wherein each of the first longitudinally coupled resonator elastic wave filter and the second longitudinally coupled resonator elastic wave filter includes five IDT electrodes.

10. The elastic wave device according to claim 1, wherein a difference between an elastic wave wavelength specified by an electrode finger pitch of the IDT electrode included in the first elastic wave resonator and an elastic wave wavelength specified by an electrode finger pitch of the IDT electrode included in the second elastic wave resonator is less than or equal to about 1.36% of the elastic wave wavelength specified by the electrode finger pitch of the IDT electrode included in the first elastic wave resonator.

11. The elastic wave device according to claim 1, wherein each of the first longitudinally coupled resonator elastic wave filter and the second longitudinally coupled resonator elastic wave filter includes at least two stages.

12. The elastic wave device according to claim 1, further comprising a third bandpass filter connected to the antenna terminal.

* * * * *